United States Patent
Kim et al.

(10) Patent No.: US 7,662,651 B2
(45) Date of Patent: Feb. 16, 2010

(54) THIN FILM TRANSISTOR ARRAY PANEL AND METHOD OF MANUFACTURING THE SAME

(75) Inventors: Kyung-Wook Kim, Seoul (KR); Joo-Ae Youn, Seongnam-si (KR); Seong-Yeong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 307 days.

(21) Appl. No.: 11/695,937

(22) Filed: Apr. 3, 2007

(65) Prior Publication Data

US 2007/0196964 A1    Aug. 23, 2007

Related U.S. Application Data

(62) Division of application No. 11/010,151, filed on Dec. 10, 2004, now Pat. No. 7,214,965.

(30) Foreign Application Priority Data

Dec. 10, 2003 (KR) .................... 10-2003-0089491

(51) Int. Cl.
*H01L 21/00* (2006.01)
(52) U.S. Cl. .................. 438/30; 438/149; 257/E21.412
(58) Field of Classification Search .......... 438/149, 438/151, 30, 163, 164; 257/E21.412
See application file for complete search history.

(56) References Cited

U.S. PATENT DOCUMENTS

| 6,590,226 | B2 * | 7/2003 | Kong et al. | 257/59 |
| 6,656,775 | B1 | 12/2003 | Matsukawa | |
| 2002/0180900 | A1 | 12/2002 | Chae et al. | |
| 2003/0151095 | A1 | 8/2003 | You et al. | |
| 2003/0197187 | A1 | 10/2003 | Kim et al. | |
| 2004/0007704 | A1 | 1/2004 | Kim | |
| 2004/0051103 | A1 * | 3/2004 | Hong et al. | 257/72 |
| 2004/0113149 | A1 * | 6/2004 | Kim | 257/59 |
| 2004/0262611 | A1 | 12/2004 | Lai | |

* cited by examiner

*Primary Examiner*—Michael Trinh
(74) *Attorney, Agent, or Firm*—Cantor Colburn LLP

(57) ABSTRACT

A plurality of gate lines having gate electrodes are formed on a substrate and a semiconductor layer is formed on a gate insulating layer covering the gate lines. A plurality of data lines intersecting the gate lines are formed on the gate insulating layer and a plurality of drain electrodes are formed extending parallel with and adjacent to the data lines. Furthermore, a plurality of storage capacitor conductors are formed to be connected to the drain electrodes and to overlap an adjacent gate line. A passivation layer made of an organic material is formed on the above structure and has a contact hole. Furthermore, a plurality of pixel electrodes are formed to be electrically connected to the drain electrodes through the contact hole.

11 Claims, 22 Drawing Sheets

127    110    124

110

140  157 127 177 167          110 175 165 154 124 163 173

175 165 154  110 171 161 151        140

THIN FILM TRANSISTOR ARRAY PANEL AND METHOD OF MANUFACTURING THE SAME

CROSS REFERENCE TO RELATED APPLICATIONS

This application is a divisional application of U.S. application Ser. No. 11/010,151, filed Dec. 10, 2004, now U.S. Pat. No. 7,214,965 which claims priority to and the benefit of Korean Patent Application No. 10-2003-0089491, filed on Dec. 10, 2003, both of which are incorporated by reference herein in their entirety.

BACKGROUND OF THE INVENTION

1. Field of the Invention

The present invention relates to a thin film transistor array panel and a method of manufacturing the same, and more particularly, to a thin film transistor array panel used in a liquid crystal display device and a method of manufacturing the same.

2. Description of the Related Art

Generally, liquid crystal display (hereinafter, referred to as "LCD") devices are one type of flat panel display devices. The LCD devices include two insulating substrates in which field-generating electrodes are formed and a liquid crystal layer disposed between the two insulating substrates. The LCD devices display images according to transmittance of light by rearrangement of liquid crystal molecules in the liquid crystal layer, as the intensity of the electric field to be applied to the liquid crystal layer changes.

A thin film transistor (hereinafter, referred to as "TFT") array panel is manufactured by one or more photolithography processes using photo-resist patterns, and on a mother glass, there are manufactured a plurality of the TFT array panels.

In the large-scale LCD devices, because each active area in one mother glass is larger than the size of a mask, a divided exposure method, in which performs one or more photolithography processes are performed to form desired patterns, is needed. In this case, there has been a problem that misalignment between the patterns in the manufacturing processes occurs. This results in varying parasitic capacitances between wirings and pixel electrodes and in dislocating the patterns due to defects such as shift, rotation, distortion, etc, of the mask. As a result, these problems vary the electrical characteristics, reduce the aperture ratio and vary the brightness in the vicinity of the boundary of the TFT array panel.

Meanwhile, the pixel electrodes have been designed to overlap gate and data lines to increase the aperture ratio, and an insulating layer is formed between the pixel electrodes and the gate and data lines to reduce the parasitic capacitance therebetween. However, there are some problems that the inversed arrangement of liquid crystal molecules unintentionally generates in the vicinity of a contact hole for contacting the pixel electrodes and drain electrodes. These problems result in a leakage light and deteriorating display quality of the LCD device. More recently, there has been proposed a wider opaque film, but this structure reduces the aperture ratio and cannot obtain the aperture ratio at higher resolutions.

SUMMARY OF THE INVENTION

An embodiment of present invention provides a thin film transistor (TFT) array panel comprising an insulating substrate; gate lines formed on the insulating substrate; a gate insulating layer formed on the gate lines; a plurality of semiconductor layers formed on the gate insulating layer; data lines formed on the semiconductor layers and having a plurality of source electrodes; drain electrodes extending parallel with and adjacent to the data lines; conductive layers electrically connected to the drain electrodes and overlapping an adjacent gate line; an insulating layer formed on or above the semiconductor layers, the drain lines, the drain electrodes, and the conductive layers; and pixel electrodes formed on the insulating layer and electrically connected to the conductive layers electrodes through a contact hole, wherein the pixel electrodes cover both the data lines and the drain electrodes.

Another embodiment of the present invention provides a thin film transistor (TFT) array panel comprising an insulating substrate; gate lines formed on the insulating substrate; a gate insulating layer formed on the gate lines; a plurality of semiconductor layers formed on the gate insulating layer; data lines formed on the semiconductor layers and having a plurality of source electrodes; drain electrodes extending parallel with and adjacent to the data lines; conductive layers electrically connected to the drain electrodes and overlapping an adjacent gate line; color filters formed on or above the semiconductor layers, the drain lines, the drain electrodes, and the conductive layers; an insulating layer formed on the color filters; and pixel electrodes formed on the insulating layer and electrically connected to the conductive layers through a contact hole, wherein the pixel electrodes cover both the data lines and the drain electrodes.

An embodiment of the present invention provides a method of manufacturing a thin film transistor (TFT) array panel on a substrate comprising forming a plurality of gate lines on the substrate; forming a plurality of gate electrodes by a photolithography process; forming a gate insulating layer on the substrate and the gate electrodes; forming a semiconductor layer on the gate insulating layer; forming an ohmic contact layer on the semiconductor layer; forming a desired active area by a photolithography process; forming a conductive layer on the gate insulating layer and the ohmic contact layer; forming a plurality of drain electrodes, data lines having a plurality of source electrodes, and a plurality of conductive patterns, the drain electrodes extending parallel with and adjacent to the data lines, and being connected to the conductive patterns; forming an insulating layer on all of the data lines, the drain electrodes, the source electrodes, the gate insulating layer, and the conductive patterns, the insulating layer having a contact hole, and forming a plurality of pixel electrodes on the insulating layer to cover both the drain electrodes and the data lines, the pixel electrodes being electrically connected to the conductive patterns through the contact hole.

Another embodiment of the present invention provides a method of manufacturing a thin film transistor (TFT) array panel on a substrate comprising forming a plurality of gate lines on the substrate; forming a plurality of gate electrodes patterned by a photolithography process using a mask; forming a gate insulating layer on the substrate and the gate electrodes; forming a semiconductor layer on the gate insulating layer; forming an ohmic contact layer on the semiconductor layer; forming a conductive layer on the ohmic contact layer; forming a plurality of drain electrodes, data lines having a plurality of source electrodes, and a plurality of conductive patterns, the drain electrodes extending parallel with and adjacent to the data lines, and being connected to the conductive patterns; forming an insulating layer on all of the data lines, the drain electrodes, the source electrodes, the gate insulating layer and the conductive patterns, the insulating layer having a contact hole, and forming a plurality of pixel electrodes on the insulating layer to cover both the drain electrodes and the date lines, the pixel electrodes being electrically connected to the conductive patterns through the contact hole.

These and other objects, features and advantages of the present invention will become apparent from the following detailed description of embodiments thereof, which is to be read in connection with the accompanying drawings.

This application relies for priority upon Korean Patent Application No. 2003-0089491 filed on Dec. 10, 2003, the contents of which are herein incorporated by reference in its entirety.

BRIEF DESCRIPTION OF THE DRAWINGS

The above and other features and advantage points of the present invention will become more apparent by describing in detailed embodiments thereof with reference to the accompanying drawings, in which.

DETAILED DESCRIPTION OF THE INVENTION

Hereinafter the embodiments of the present invention will be described in detail with reference to the accompanied drawings.

A structure of a TFT array panel for a LCD device according to an embodiment of the present invention will be described with reference to FIGS. 1 to 3.

Figure 1:
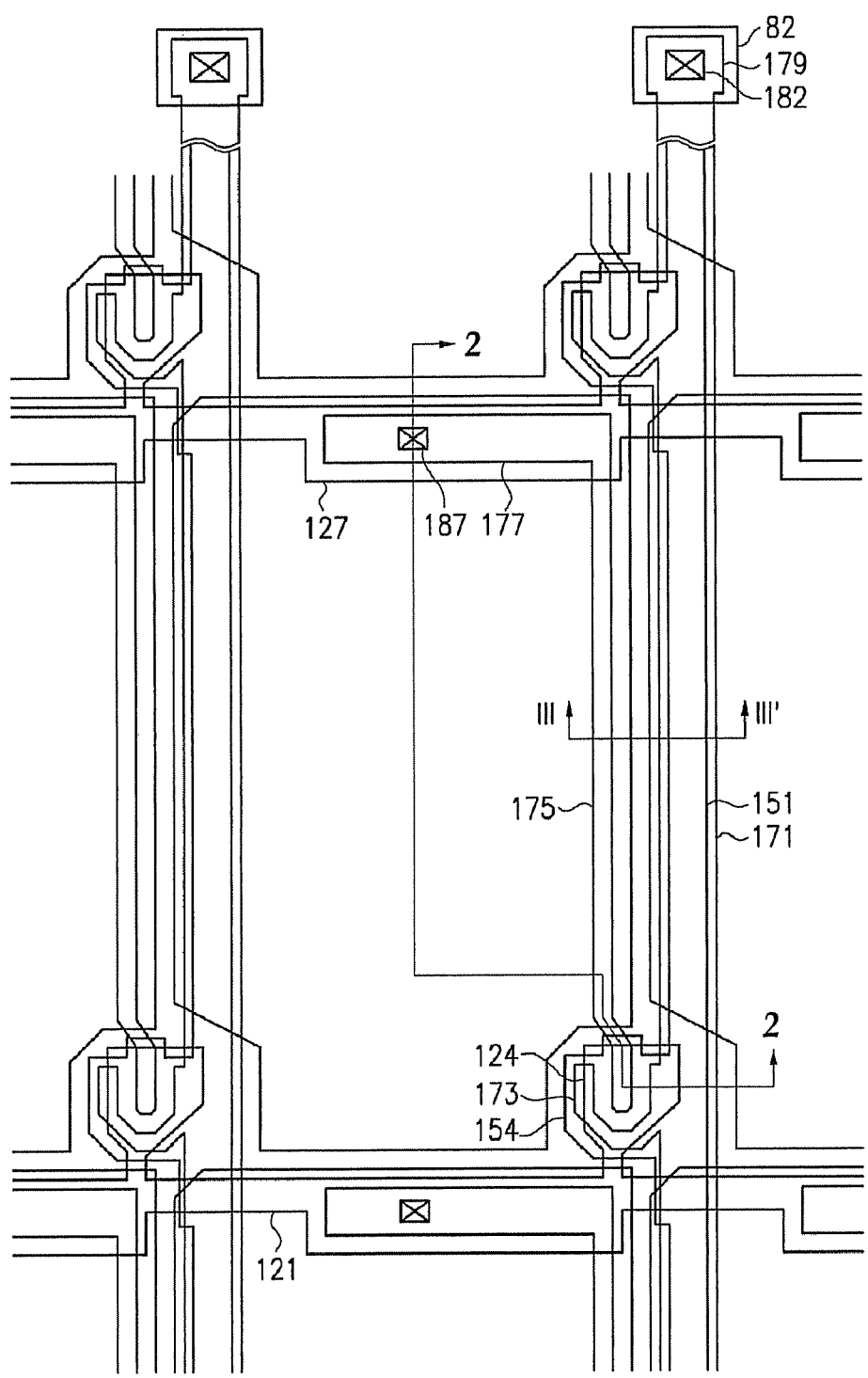
FIG. 1 is a layout view of a TFT array panel for a LCD device according to an embodiment of the present invention.
Figure 2:
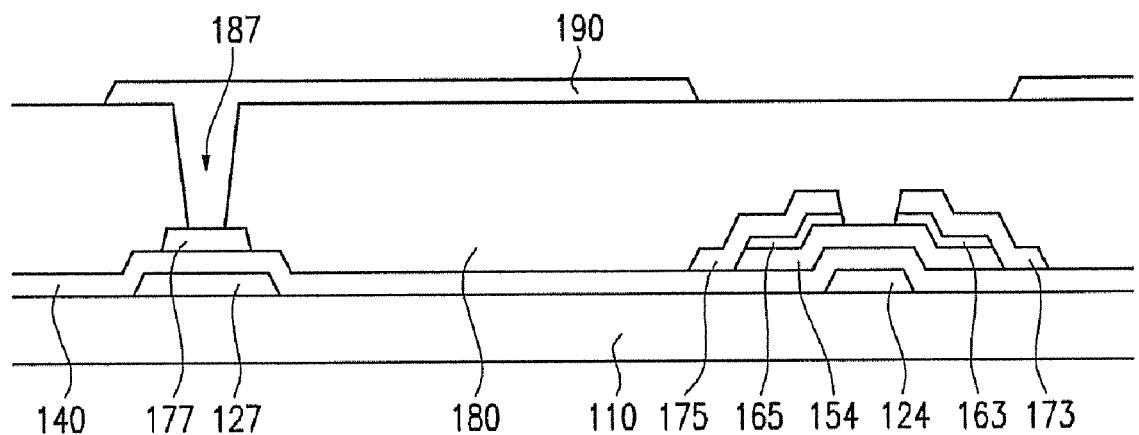
FIG. 2 is a cross-sectional view taken along line 2-2 of FIG. 1.
Figure 3:
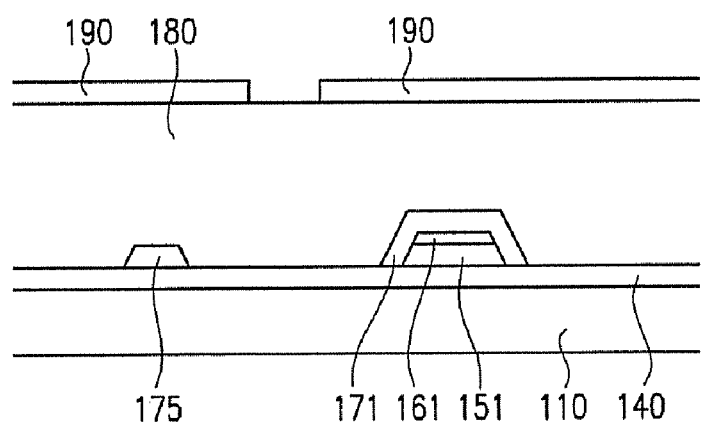
FIG. 3 is a cross-sectional view taken along line 3-3 of FIG. 1.

FIG. 1 is a layout view of the TFT array panel for the LCD device according to an embodiment of the present invention, FIG. 2 is a cross-sectional view taken along line 2-2 of FIG. 1, and FIG. 3 is a cross-sectional view taken along line 3-3 of FIG. 1.

A plurality of gate lines 121 (only two are shown) are formed on an insulating substrate 110. The gate lines 121 are formed in the horizontal direction, and have first extended portions which become gate electrodes 124 and second extended portions 127 extended from the gate lines 121. The gate lines 121 may include a two-layered structure, each of which has different physical characteristics. For example, one layer is made of a metal having a low resistivity, such as an aluminum-based conductive layer and the other is made of a material having good physical, chemical and electrical contact characteristics with IZO (Indium Zinc Oxide) or ITO (Indium Tin Oxide), such as Mo, MoW alloy, Cr, etc. Edge portions of the gate lines 121 are inclined and the inclined angles are about 30-80° with respect to the surface of the insulating substrate 110, respectively.

Then, a gate insulating layer 140 made of a material such as silicon nitride (SiNx), etc, is formed on the gate lines 121. A semiconductor layer 151 made of hydrogenated semiconductor (hereinafter, referred to as "a-Si") is formed on the gate insulating layer 140. The semiconductor layer 151 is formed in the vertical direction with respect to the gate lines 121 and has third extended portions 154 extended from thereto. Furthermore, the semiconductor layer 151 becomes wider at the portion meeting the gate lines 121.

Then, first and second ohmic contact layers 161 and 165 made of, for example, silicide or n-doped semiconductor, are formed on the semiconductor layer 151. The first ohmic contact layers 161 have stripe-shaped structures and the second ohmic contact layers 165 have island-shaped structures. The first ohmic contact layers 161 have protruded portions 163 and the protruded portions 163 are formed on the third extended portions 154 along with the second ohmic contact layers 165. Furthermore, edge portions of the semiconductor layer 151 and the first and second ohmic contact layers 161 and 165 are inclined and the inclined angles are about 30-80° with respect to the surface of the insulating substrate 110.

A plurality of data lines 171 (only two are shown), a plurality of drain electrodes 175 (only four are shown) and a plurality of storage capacitor conductors 177 (only two are shown) are formed on the first and second ohmic contact layers 161 and 165 and the gate insulating layer 140, respectively. The data lines 171 are formed intersecting the gate lines 121 and have a plurality of source electrodes 173 (only four are shown). The source electrodes 173 have a structure symmetrical to the drain electrodes 175 with respect to the gate electrodes 124. The gate, source and drain electrodes 124, 173 and 175 along with the third extended portion 154 become a thin film transistor (hereinafter, referred to as "TFT"), and the channel region of the TFT is formed in the third extended portion 154 between the source and drain electrodes 173 and 175.

The drain electrodes 175 are formed extending parallel with and adjacent to the data lines 171 and fully overlap pixel electrodes 190. In more detail, the drain electrodes 175 are covered by black matrixes (not shown). According to this configuration of the present invention, an increased aperture ratio is obtained in an active region. Furthermore, since the storage capacitor conductors 177 are connected to the drain electrodes 175 and overlap the second extended portions 127 of the adjacent gate lines 121, it may suppress reduction of the aperture ratio in an active region.

The data lines 171, the drain electrodes 175 and the storage capacitor conductors 177 have a two-layered structure, respectively, for example, a lower layer made of Mo, Mo alloy, Cr, etc. and an upper layer made of an aluminum-based metal, but may be formed in a the single layer. Edge portions of the data lines 171, the drain electrodes 175 and the storage capacitor conductors 177 are inclined in the range of about 30-80°, respectively.

The first and second ohmic contact layers 161 and 165 are disposed between the semiconductor layer 151 and the data lines 171 and between the semiconductor layer 151 and the drain electrodes 175, respectively. The semiconductor layer 151 is exposed between the source and drain electrodes 173 and 175, and between the data lines 171 and the drain electrodes 175.

A passivation layer 180, which is made of one of an organic material having good flatness and photosensitivity and an insulating material having a low dielectric constant, such as a-Si:C:O, a-Si:O:F, etc. is formed on the data lines 171, the drain electrodes 175, the storage capacitor conductors 177 and the exposed portions of the semiconductor layer 151 by a PECVD (Plasma Enhanced Chemical Vapor Deposition) method.

In this embodiment, the passivation layer 180 may include an insulating layer made of one of silicon nitride and silicon oxide to prevent the passivation layer 180 from contacting the exposed portions of the semiconductor layer 151 between the data lines 171 and the drain electrodes 175.

Then, a plurality of contact holes 182 and 187 (only two are shown, respectively) are formed through the passivation layer 180 to expose the data lines 171 and the storage capacitor conductors 177. The contact holes 187 are wider than the contact holes 182 and are formed on the storage capacitor conductors 177. According to this configuration, although the unintended arrangement of liquid crystal molecules along the inclined surface of the contact holes 187 in the vicinity of the drain electrodes 175 causes leakage of light, the leakage of light is blocked by one of the storage capacitor conductors 177 and the second extended portion 127. As a result, the present invention may have no disclination and suppressed reduction of aperture ratio in the active region.

The contact holes 182 expose the end portions 179 of the data lines 171 through the passivation layer 180 and the data driving circuits (not shown) may be connected to the data lines 171 by an ACF (not shown) through the contact holes 182. The end portions 179 of the data lines 171 may be wider than the data lines 171. Furthermore, the end portions of the gate lines 121 may have a contact hole (not shown). At this time, the passivation layer 180 has a plurality of contact holes that expose the gate insulating layer 140 and the end portions (not shown) of the gate lines 121. Meanwhile, because the gate driving circuits (not shown) may be formed on the substrate 110 by the same TFT manufacturing processes, the gate lines 121 may have no contact holes at their end portions. The contact holes 182 and 187 may not expose an aluminum-based conductive layer for good contact characteristics with one of ITO and IZO layers, and may expose the boundaries of the end portions of the data lines 171 and the storage capacitor conductors 177.

A plurality of pixel electrodes 190 (only two are shown) and a plurality of contact assistant members 82 (only two are shown) made of one of IZO and ITO layers are formed on the passivation layer 180. The pixel electrodes 190 are electrically connected to the drain electrodes 175 and the storage capacitor conductors 177 through the contact holes 187.

The storage capacitor conductors 177, which contact the pixel electrodes 190 and overlap the second extended portion 127, are formed under the passivation layer 180 to narrow the gap between the storage capacitor conductors 177 and the pixel electrodes 190. As described the above, the pixel electrodes 190 overlap the adjacent gate lines 121 and cover the data lines 171, but the pixel electrodes 190 may not overlap the adjacent gate lines 121 and not cover the data lines 171.

The contact assistant members 82 contact the end portions 179 of the data lines 171 through the contact holes 182. The contact assistant members 82 make the end portions 179 of the data lines 171 contact external devices, such as the driving circuits (not shown), but the contact assistant members 82 may be omitted. Furthermore, the end portions (not shown) of the gate lines 121 may have the contact assistant members.

In this embodiment, since the pixel electrodes 190 cover the data lines 171 and are electrically connected to the drain electrodes 175, the parasitic capacitance therebetween becomes constant irrespective of any misalignment error in manufacturing processes. According to this configuration, the present invention may suppress fluctuation of the pixel voltages applied to the pixel electrodes 190 and suppress reduction of the aperture ratio in an active region.

In another embodiment, the pixel electrodes 190 are made of transparent conductive polymer, etc. and may be made of a non-transparent reflective metal in a reflective LCD device. In this case, the contact assistant members 82 are made of a material different from the pixel electrodes 190, such as one of IZO and ITO.

Figure 4:
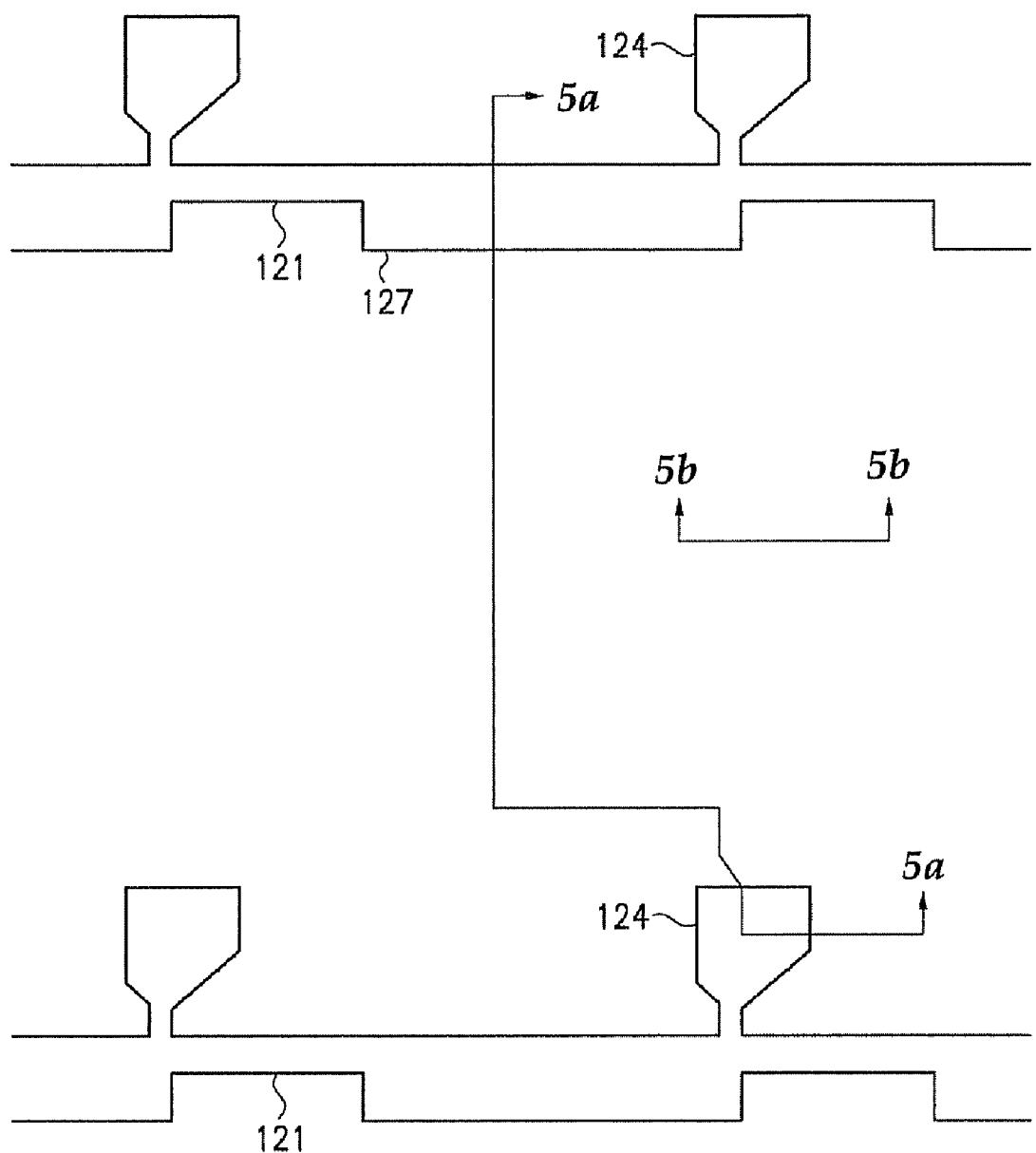
FIG. 4 is a layout view of the TFT array panel in intermediate steps of the manufacturing method of the TFT array panel of FIGS. 1 to 3.
Figure 5A:
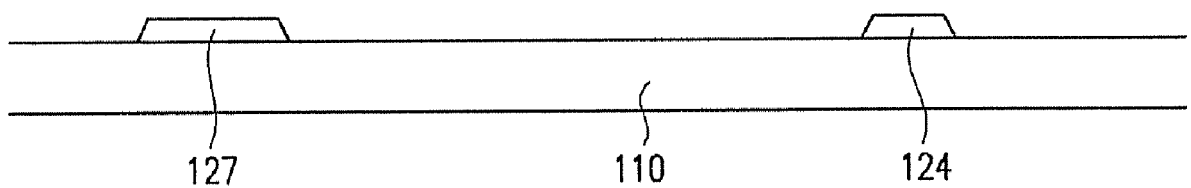
FIGS. 5a and 5b are cross-sectional views taken along lines 5a-5a and 5b-5b of FIG. 4.
Figure 5B:
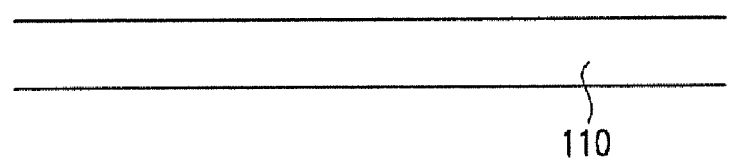
Figure 6:
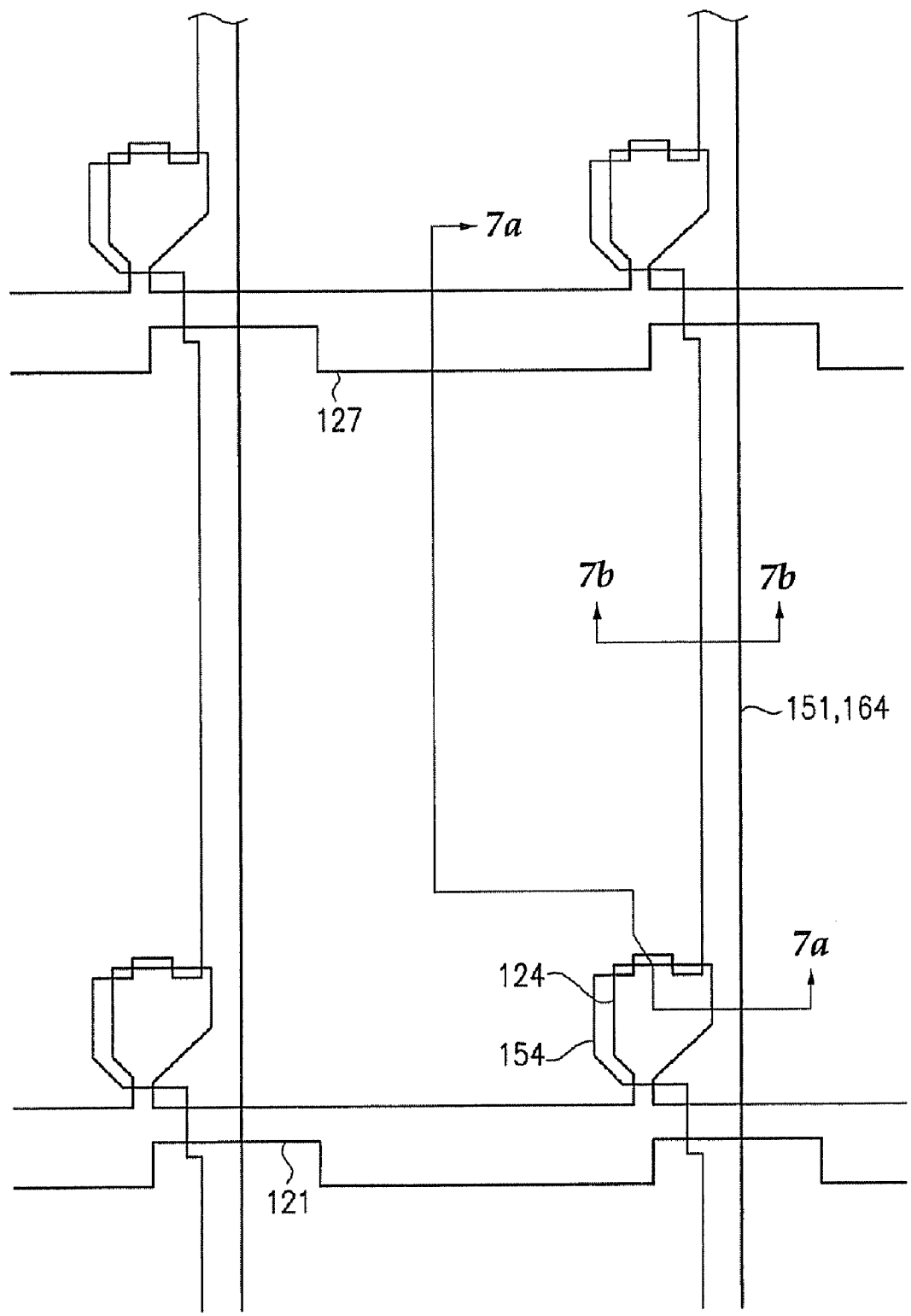
FIG. 6 is a layout view of the TFT array panel in intermediate steps of the manufacturing method of the TFT array panel of FIGS. 1 to 3.
Figure 7A:
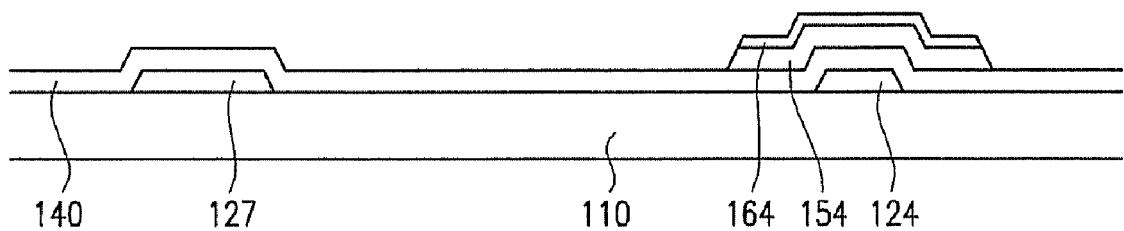
FIGS. 7a and 7b are cross-sectional views taken along lines 7a-7a and 7b-7b of FIG. 6.
Figure 7B:
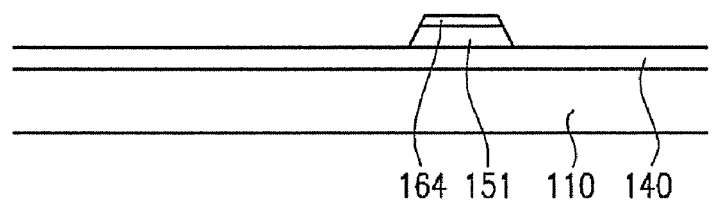
Figure 8:
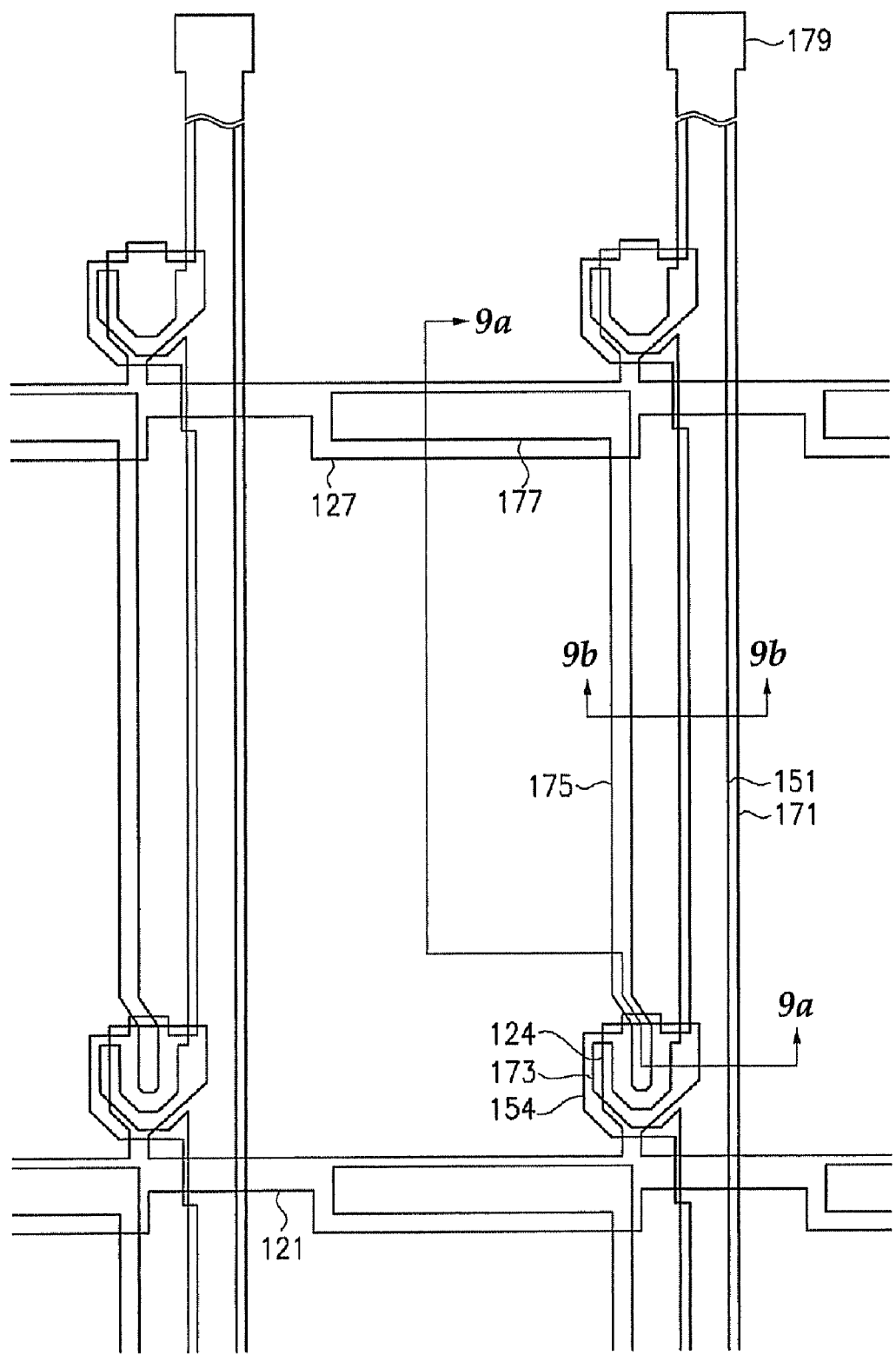
FIG. 8 is a layout view of the TFT array panel in intermediate steps of the manufacturing method of the TFT array panel of FIGS. 1 to 3.
Figure 9A:
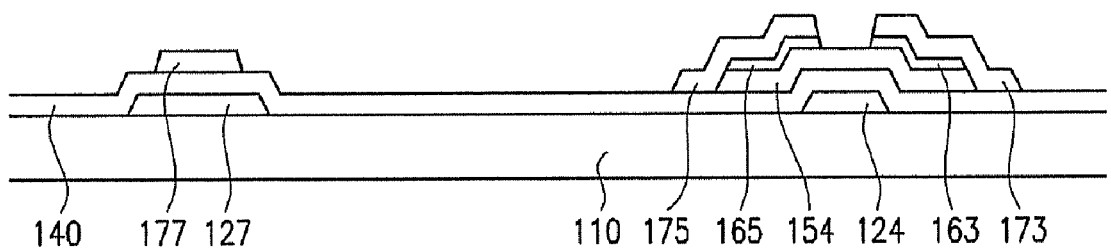
FIGS. 9a and 9b are cross-sectional views taken along lines 9a-9a and 9b-9b of FIG. 8.
Figure 9B:
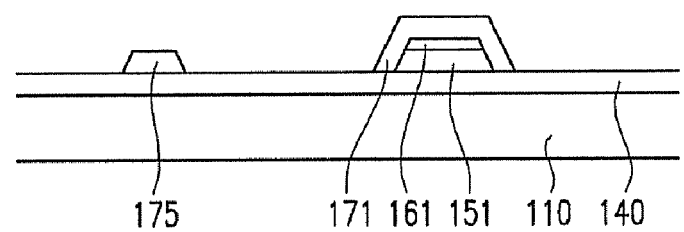
Figure 10:
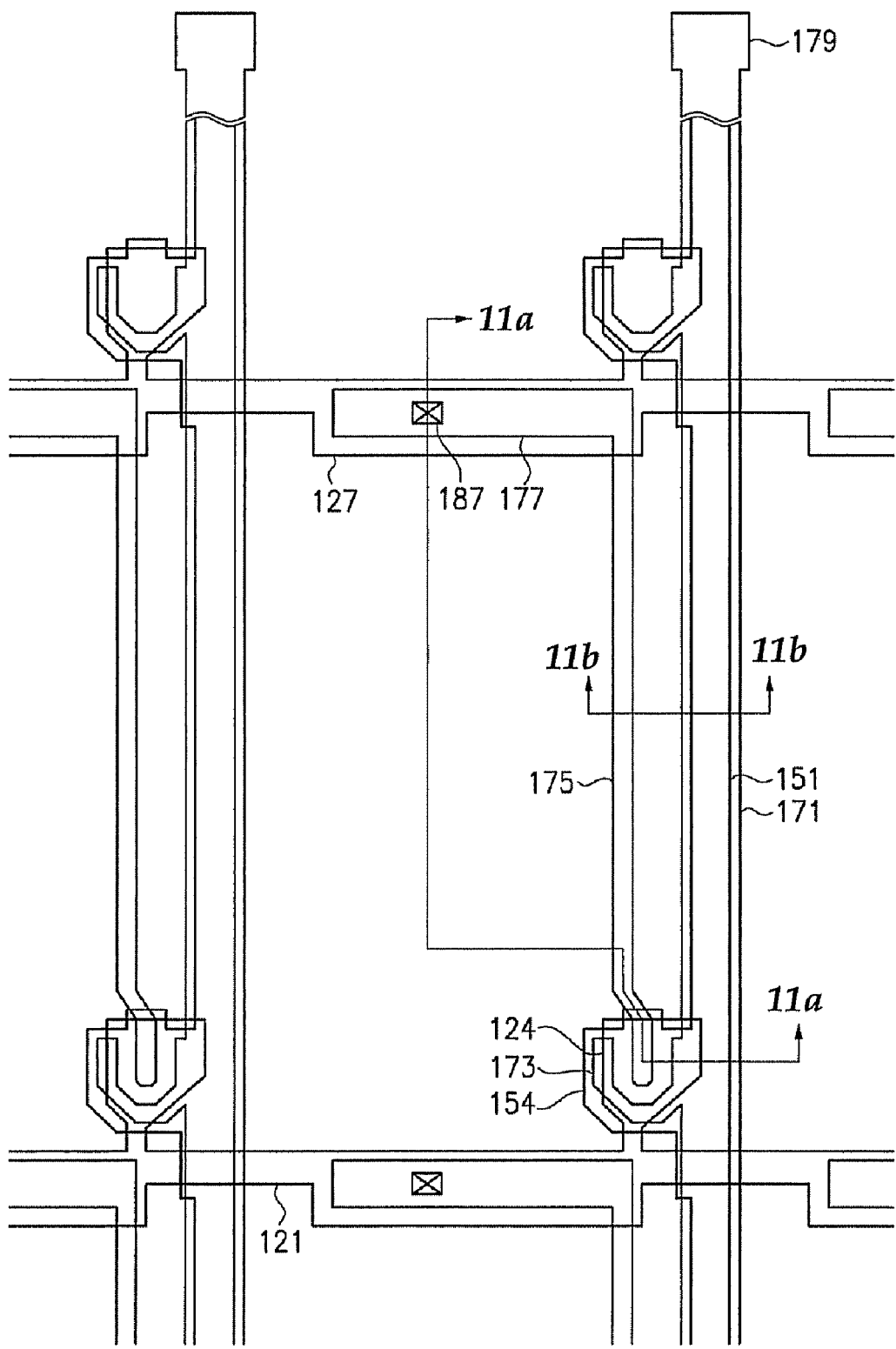
FIG. 10 is a layout view of the TFT array panel in intermediate steps of the manufacturing method of the TFT array panel of FIGS. 1 to 3.
Figure 11A:
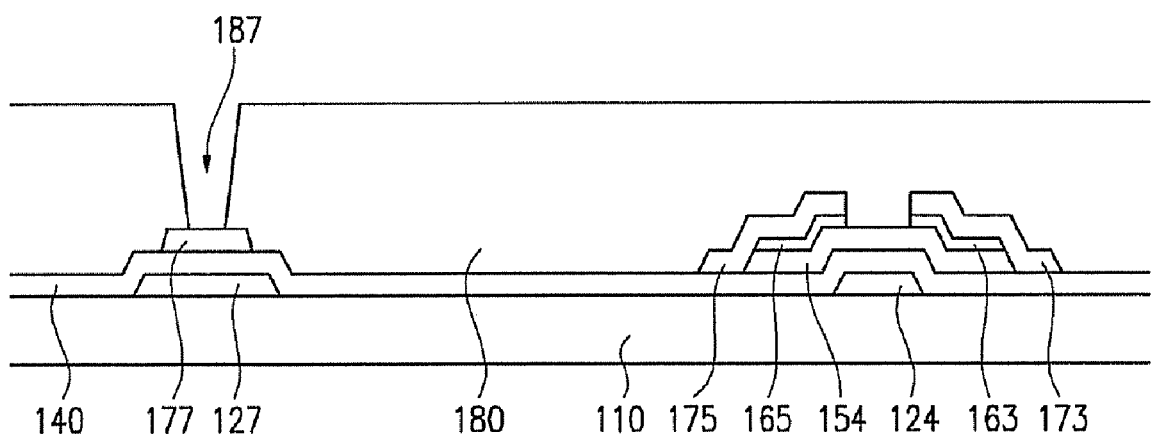
FIGS. 11a and 11b are cross-sectional views taken along lines 11a-11a and 11b-11b of FIG. 10.
Figure 11B:
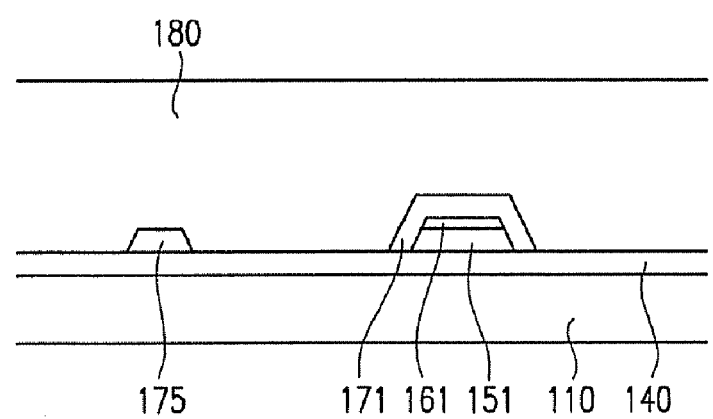

Now, a method of manufacturing the TFT array panel for the LCD device shown in FIGS. 1 to 3 according to an embodiment of the present invention will be described in more detail with reference to FIGS. 4 to 11b FIG. 4, FIG. 6, FIG. 8 and FIG. 10 are layout views of the TFT array panel in intermediate of the manufacturing method of the TFT array panel shown in FIGS. 1 to 3, FIGS. 5a and 5b are cross-sectional views taken along lines 5a-5a and 5b-5b in FIG. 4, FIGS. 7a and 7b are cross-sectional views taken along lines 7a-7a and 7b-7b in FIG. 6, FIGS. 9a and 9b are cross-sectional views taken along lines 9a-9a and 9b-9b in FIG. 8, and FIGS. 11a and 11b are cross-sectional views taken along lines 11a-11a and 11b-11b in FIG. 10.

First, a conductive layer is deposited on the insulating substrate 110 made, for example, of a transparent glass by a sputtering method, and then patterned by a photolithography process. At this time, as shown in FIGS. 4 to 5b, the gate lines 121 having the gate electrodes 124 and the second extended portions 127 are formed on the insulating substrate 110.

Then, as shown in FIGS. 6 to 7b, the gate insulating layer 140, an intrinsic semiconductor layer 154 and an extrinsic semiconductor layer 164 are sequentially deposited. The intrinsic and extrinsic semiconductor layers 154 and 164 are patterned by a photolithography process as a mask. Herein, the gate insulating layer 140 may be made of silicon nitride and may be deposited in the range of about 2,000~5,000 Å at about 250~500° C.

Then, as shown in FIGS. 8 to 9b, a conductive layer is deposited; a photoresist film is deposited on the conductive layer and then patterned by a photolithography process using a mask. At this time, the data lines 171 having the source electrodes 173, the drain electrodes 175 and the storage capacitor conductors 177 are formed.

Then, as the photoresist film is left on or removed from the data lines 171 and the drain electrodes 175, the extrinsic semiconductor layers 164 not covered by all of the data lines 171, the drain electrodes 175 and the storage capacitor conductors 177 are fully etched by an etching method. At this time, the first and second ohmic contact layers 161 and 165, and third ohmic contact layers 163 are formed. Herein, the extrinsic semiconductor layers 164 are etched using $CF_4$+ HCl gas to prevent the molybdenum-based conductive layer used as materials of the data lines 171 and the drain electrodes 175 from being damaged. For stabilization of the surface of the semiconductor layer 151, the treatment of oxygen plasma may be performed in the following process.

Then, the passivation layer 180 is formed by depositing one of an inorganic insulating layer, such as silicon nitride, and an organic insulating layer having a low dielectric constant. The photoresist film is then coated on the passivation layer 180 by a spin coating method, and the passivation layer 180 and the gate insulating layer 140 are patterned by a photolithography process using a mask. At this time, the contact holes 182 and 187 are formed by exposing the storage capacitor conductors 177 and the end portions 179 of the date lines 171.

Finally, as shown in FIGS. 1 to 3, one of ITO and IZO layers is deposited by a sputtering method and patterned by a photolithography process. At this time, the pixel electrodes 190 and the contact assistant members 82 are formed. Herein, the sputtering temperature may be less than about 250° C. to minimize a contact resistance with other layers. In this embodiment, the TFT array panel for the LCD device is manufactured by photolithography processes using five masks, but may be manufactured using four masks.

Now, a method of manufacturing the TFT array panel for the LCD device using four masks according to another embodiment of the present invention will be described in more detail with reference to the drawings.

First, the pixel structure of the TFT array panel for the LCD device will be described with reference to FIGS. 12 to 14.

Figure 12:
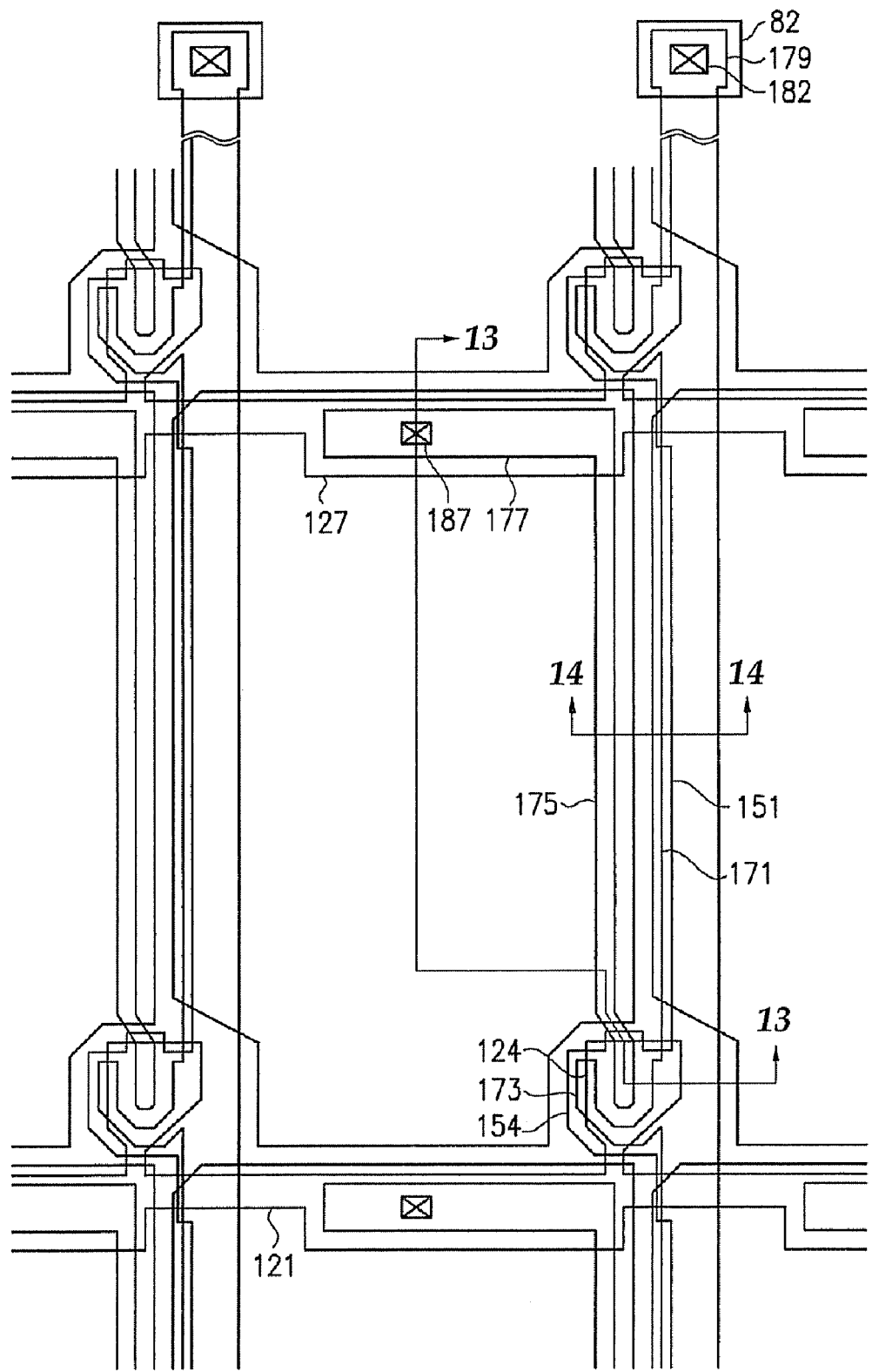
FIG. 12 is a layout view of the TFT array panel for the LCD device according to another embodiment of the present invention.
Figure 13:
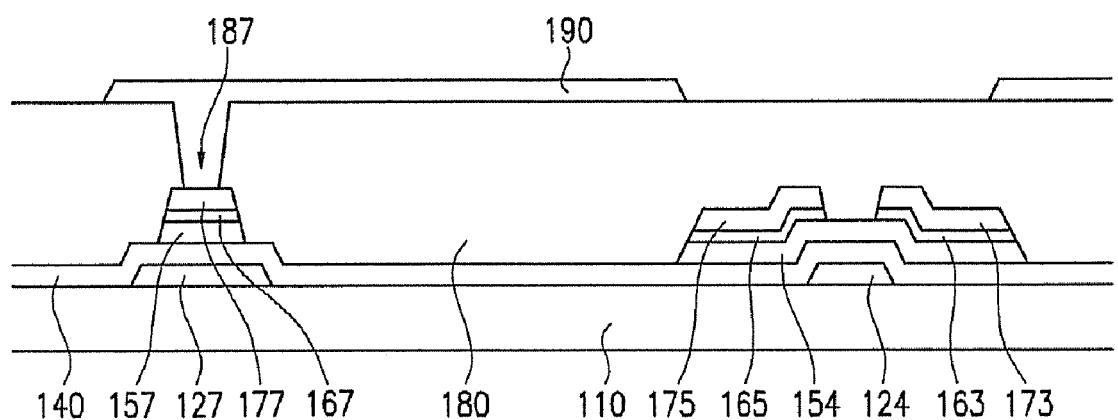
FIGS. 13 and 14 are cross-sectional views taken along lines 13-13 and 14-14 of FIG. 12.
Figure 14:
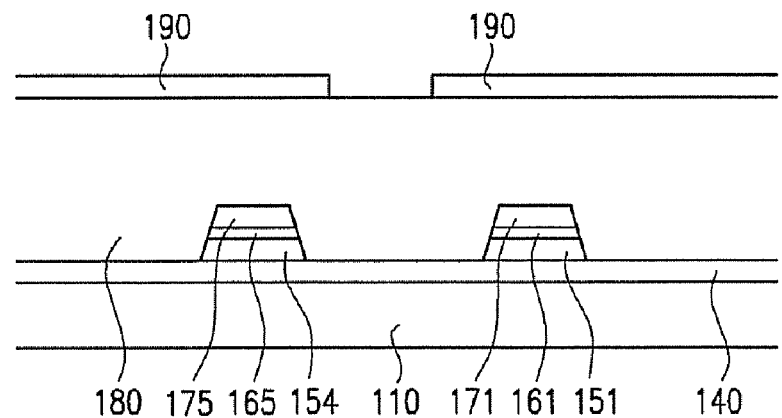

FIG. 12 is a layout view of the TFT array panel for the LCD device according to another embodiment of the present invention and FIGS. 13 and 14 are cross-sectional views taken along lines 13-13 and 14-14 in FIG. 12. As shown in FIGS. 12 to 14, the TFT array panel has the same structure as that of the TFT array panel in FIGS. 1 to 3 with the exception that semiconductor layers 157 and ohmic contact layers 167 are formed between the storage capacitor conductors 177 and the gate insulating layer 140, and the semiconductor layers 154 and the ohmic contact layers 165 are formed between the drain electrodes 175 and the gate insulating layer 140. Therefore, the detailed description will be omitted and the same label and reference numerals will be used.

Next, a method of manufacturing the TFT array panel for the LCD device in FIGS. 12 to 14 will be described in more detail with reference to FIGS. 15 to 22b.

Figure 15:
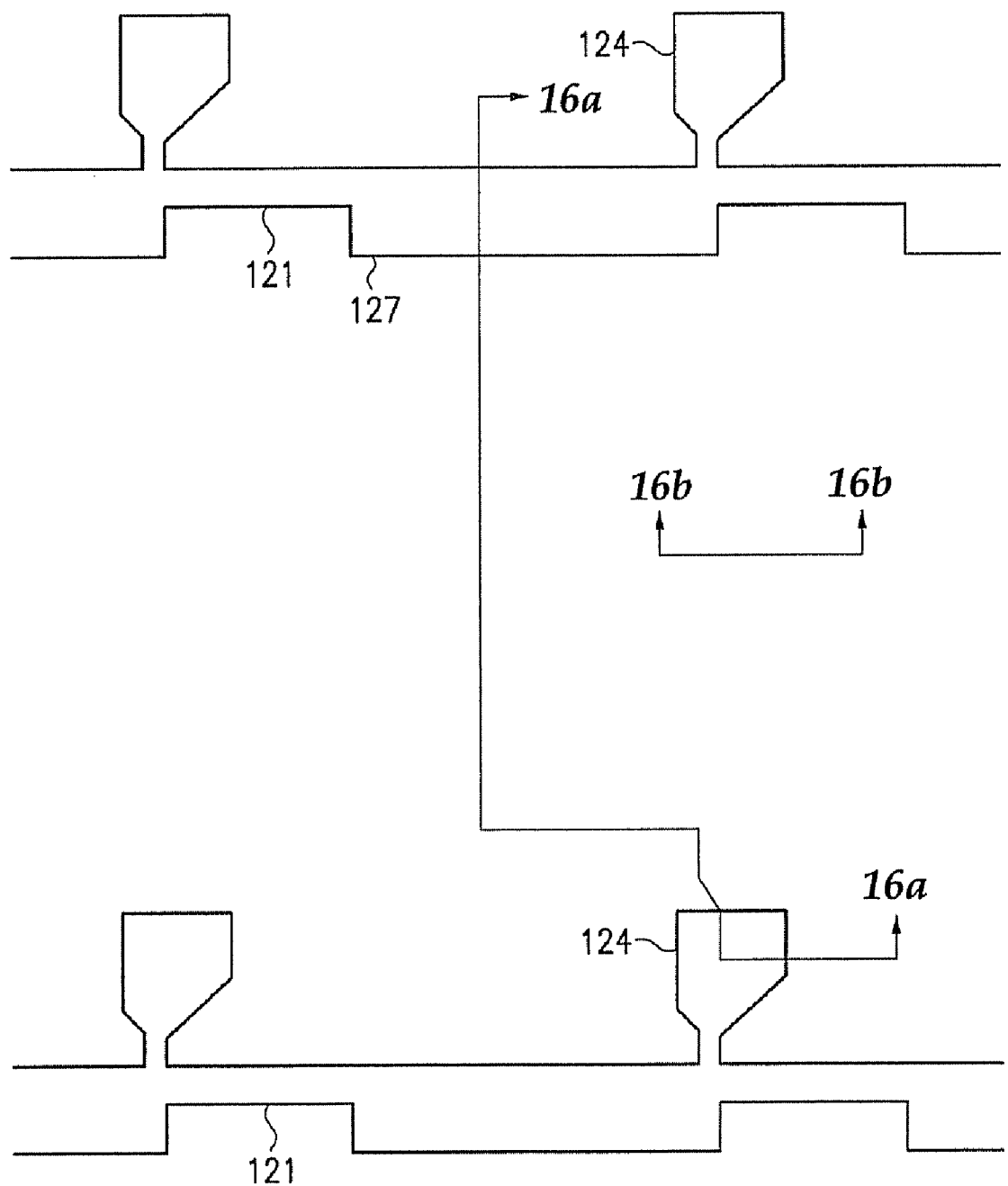
FIG. 15 is a layout view of the TFT array panel for the LCD device in the first manufacturing step according to another embodiment of the present invention.
Figure 16A:
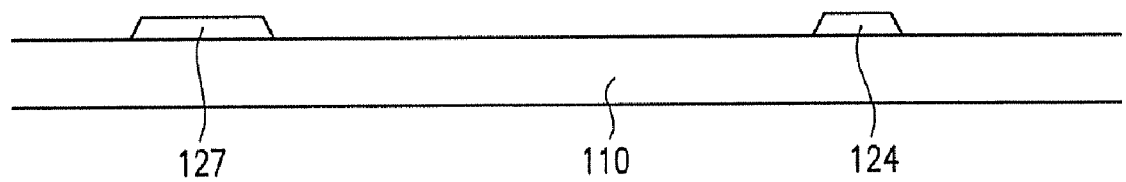
FIGS. 16a and 16b are cross-sectional views taken along lines 16a-16a and 16b-16b of FIG. 15.
Figure 16B:
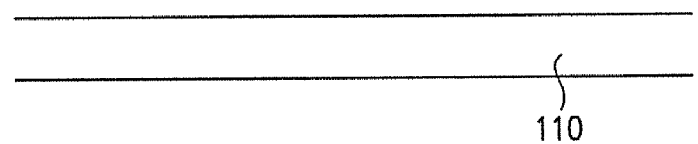

FIG. 15 is a layout view of the TFT array panel in a manufacturing method of the TFT array panel. FIGS. 16a and 16b are cross-sectional views taken along lines 16a-16a and 16b-16b in FIG. 15, FIGS. 17a and 17b are cross-sectional views showing features formed on FIGS. 16a and 16b, FIGS. 18a and 18b are cross-sectional views showing features formed on FIGS. 17a and 17b, FIG. 19 is a layout view of the TFT array panel showing features formed subsequent to FIGS. 18a and 18b, FIGS. 20a and 20b are cross-sectional views taken along lines 20a-20a and 20b-20b in FIG. 19, FIG. 21 is a layout view of the TFT array panel in the next step of FIGS. 20a and 20b, and FIGS. 22a and 22b are a cross-sectional view taken along lines 21-21 and 21'-21' in FIG. 21.

As shown in FIG. 15 and FIGS. 16a and 16b, a conductive layer is deposited on the insulating substrate 110 and patterned by a photolithography process. At this time, the gate lines 121 having the gate electrodes 124 are formed.

Figure 17A:
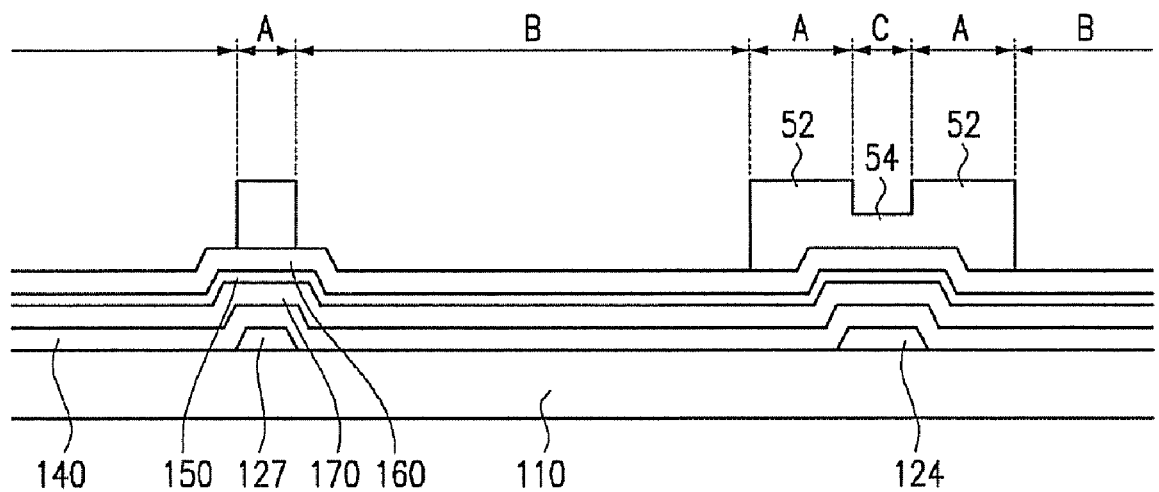
FIGS. 17a and 17b are cross-sectional views depicting subsequent to FIGS. 16a and 16b.
Figure 17B:
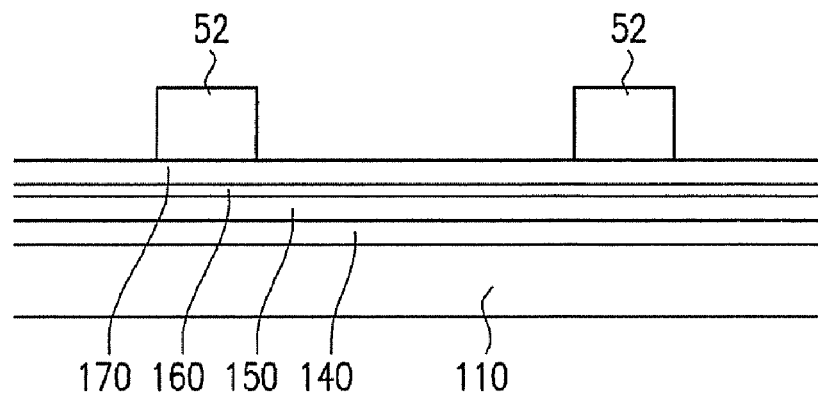

As shown in FIGS. 17a and 17b, the gate insulating layer 140, an intrinsic semiconductor layer 150 and an extrinsic semiconductor layer 160 are sequentially deposited by a CVD method, such as a PECVD method, in the thickness of about 1,500~5,000 Å, about 500~2,000 Å, and about 300~600 Å, respectively. Then, a conductive layer 170 is deposited by, for example, a sputtering method, and then the photoresist film is coated in the thickness of about 1~2 um. Photoresist patterns 52 and 54 are formed by developing the photoresist film using a mask (not shown).

At this time, the developed photoresist film includes three "A", "B" and "C" regions. Reference numeral 52 is the "A" region (hereinafter, referred to as "a wiring region") and reference numeral 54 is the "C" region (hereinafter, referred to as "a channel region"). The "B" region (hereinafter, referred to as "other region") has no reference numeral because the conductive layer 170 is fully exposed in the "B" region. Herein, the thickness ratio of the "A" and "C" regions depends on the condition of the next process. For example, the thickness of the "C" region 54 may be half of the "A" region 52 and may be less than about 4,000 Å.

For convenience, the conductive layer 170, the extrinsic semiconductor layer 160 and the intrinsic semiconductor layer 150 in the "A" region are defined as a $1^{st}$ portion, the conductive layer 170, the extrinsic semiconductor layer 160 and the intrinsic semiconductor layer 150 in the "C" region are defined as a $2^{nd}$ portion, and the conductive layer 170, the extrinsic semiconductor layer 160 and the intrinsic semiconductor layer 150 in the "B" region are defined as a $3^{rd}$ portion.

Figure 19:
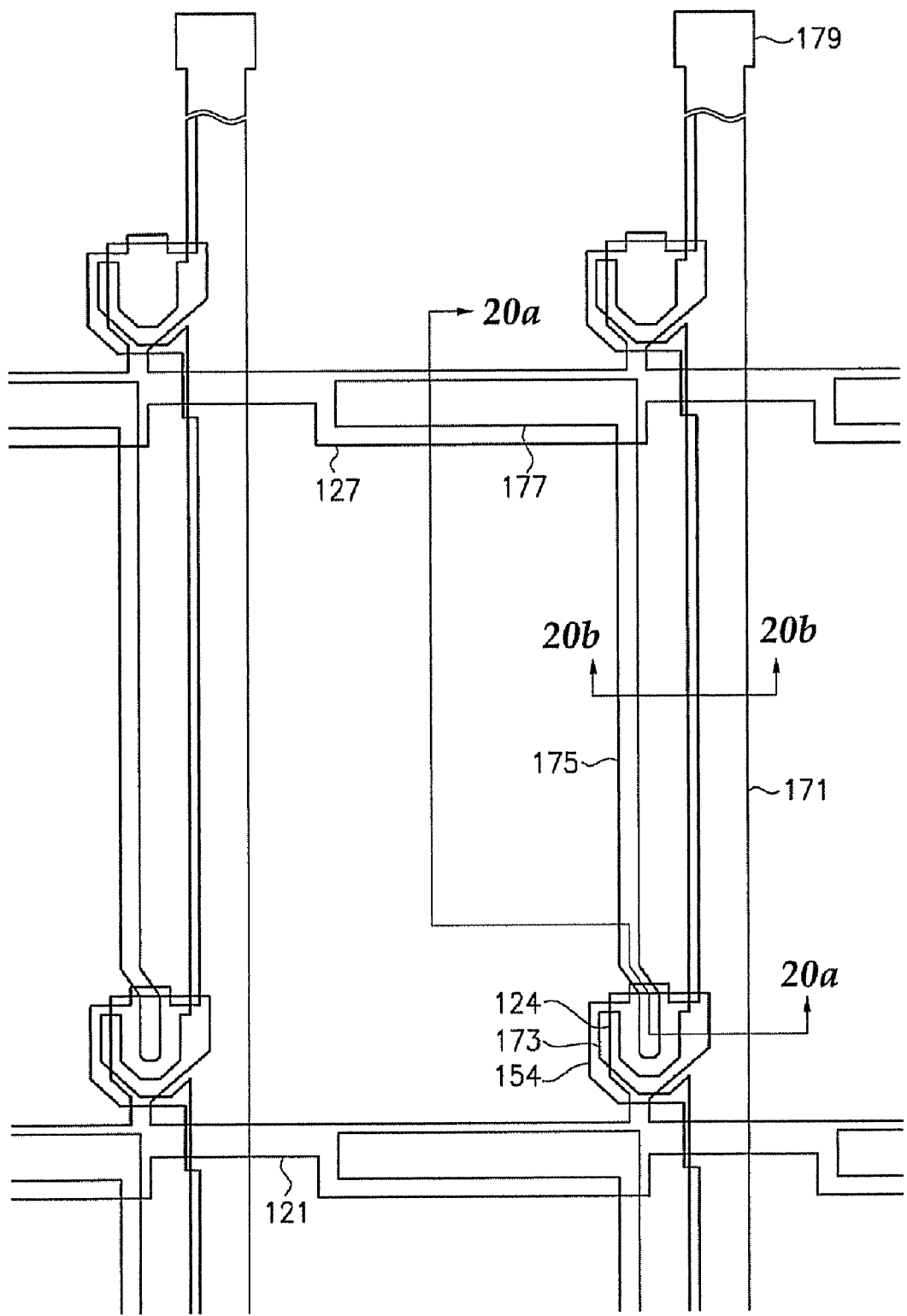
FIG. 19 is a layout view of the TFT array panel for the LCD device depicting subsequent to FIGS. 18a and 18b.
Figure 20A:
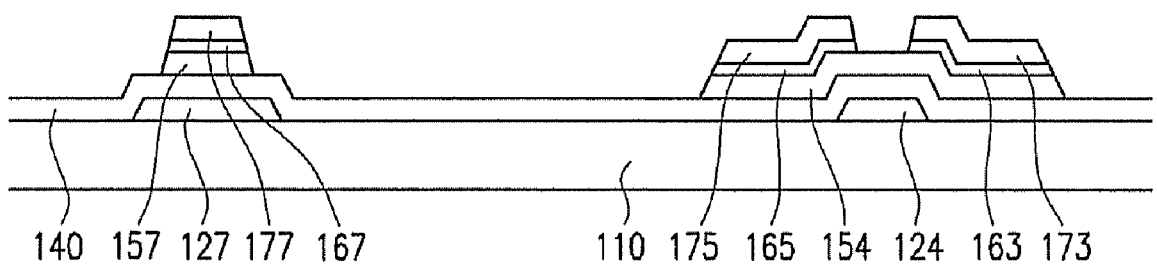
FIGS. 20a and 20b are cross-sectional views taken along lines 20a-20a and 20b-20b of FIG. 19.
Figure 20B:
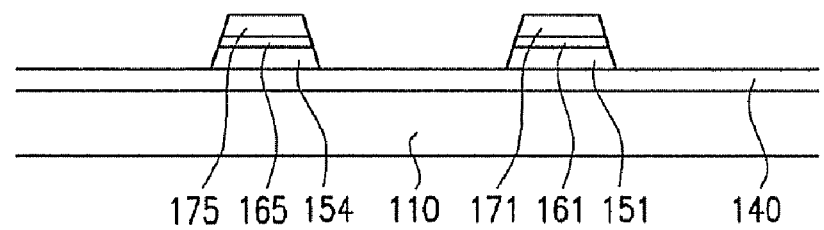
Figure 21:
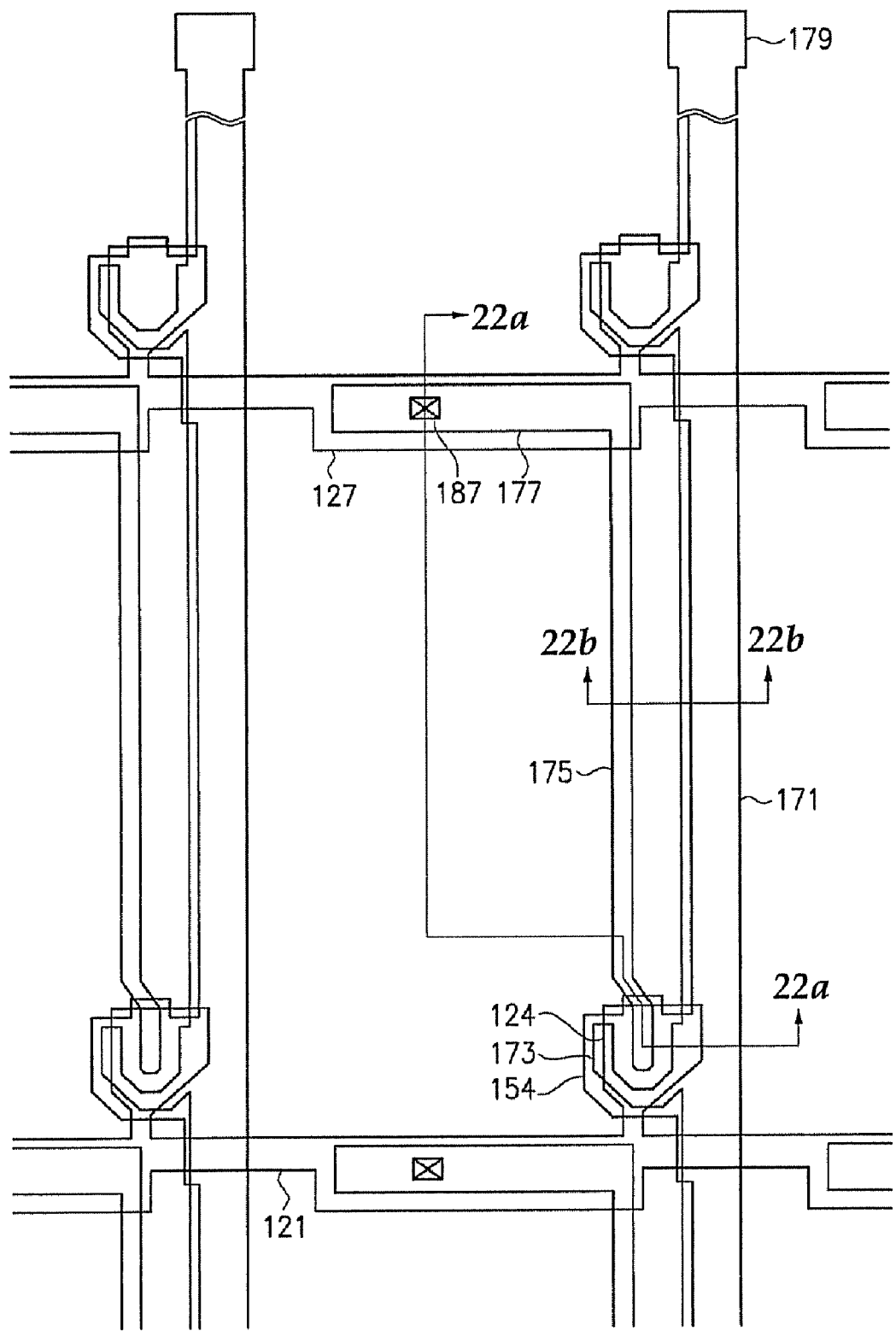
FIG. 21 is a layout of the TFT array panel for the LCD device depicting subsequent to FIGS. 20a and 20b.

A first method of manufacturing the structure of the TFT array panel in FIG. 19 and FIGS. 20a and 20b is described below.

(1) Removing the conductive layer 170, the extrinsic semiconductor layer 160 and the intrinsic semiconductor layer 150 in the $3^{rd}$ portion,
(2) Removing the photoresist film in the $2^{nd}$ portion,
(3) Removing the conductive layer 170 and the extrinsic semiconductor layer 160 in the $2^{nd}$ portion, and
(4) Removing the photoresist film in the $1^{st}$ portion.

A second method of manufacturing the structure of the TFT array panel in FIG. 19, and FIGS. 20a and 20b is described below.

(1) Removing the conductive layer 170 in the $3^{rd}$ portion,
(2) Removing the photoresist film in the $2^{nd}$ portion,
(3) Removing the extrinsic semiconductor layer 160 and the intrinsic semiconductor layer 150 in the $3^{rd}$ portion,
(4) Removing the conductive layer 170 in the $2^{nd}$ portion,
(5) Removing the photoresist film in the $1^{st}$ portion, and
(6) Removing the extrinsic semiconductor layer 160 in the $2^{nd}$ portion.

Herein, the first method will be described in more detail with reference to the drawings.

Figure 18A:
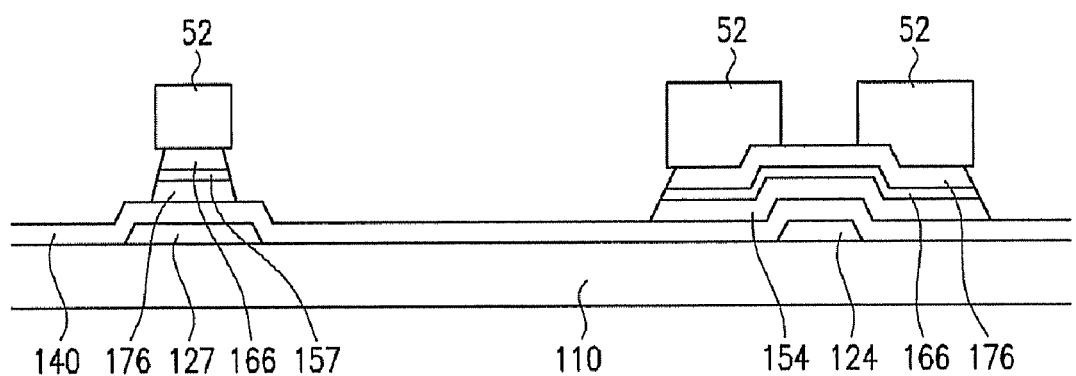
FIGS. 18a and 18b are cross-sectional views depicting subsequent to FIGS. 17a and 17b.
Figure 18B:
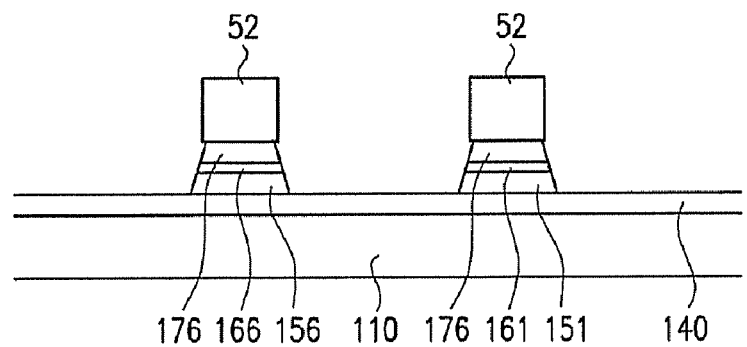

As shown in FIGS. 18a and 18b, the conductive layer 170 exposed in the $3^{rd}$ portion is etched by one of dry and wet etching methods, and at this time, the extrinsic semiconductor layer 160 in the $3^{rd}$ portion is exposed. For example, the aluminum-based conductive layer is etched by a wet etching method and the molybdenum-based conductive layer may be etched by one of dry and wet etching methods. In the dry etching, some of the top of the photoresist films 52 and 54 may be etched, too.

Then, the extrinsic semiconductor layer 160 and the intrinsic semiconductor layer 150 in the $3^{rd}$ portion and the photoresist film in the $2^{nd}$ portion are removed, and at this time, the conductive layer 170 in the $2^{nd}$ portion is exposed. The photoresist film 54 in the $2^{nd}$ portion, and the extrinsic and intrinsic semiconductor layers 160 and 150 in the $3^{rd}$ portion may be simultaneously or separately removed. Herein, the remaining photoresist film in the $2^{nd}$ portion may be removed by an ashing method and the first and second intrinsic semiconductor layers 151 and 157 are formed.

Then, as shown in FIGS. 19, 20a and 20b, the conductive layer 170 and the extrinsic semiconductor layer 160 in the $2^{nd}$ portion are etched and the photoresist film in the $1^{st}$ portion is also removed. At this time, since some of the top of the third extended portion 154 in the $2^{nd}$ portion may be removed, the thickness of the third extended portion 154 may become smaller. The conductive layer 170 is formed as the data line 171, the drain electrode 175 and the storage capacitor conductor 177, and the extrinsic semiconductor layer 160 is formed as the first, second and third ohmic contact layers 161, 165 and 163, and a fourth ohmic contact layer 167.

Figure 22A:
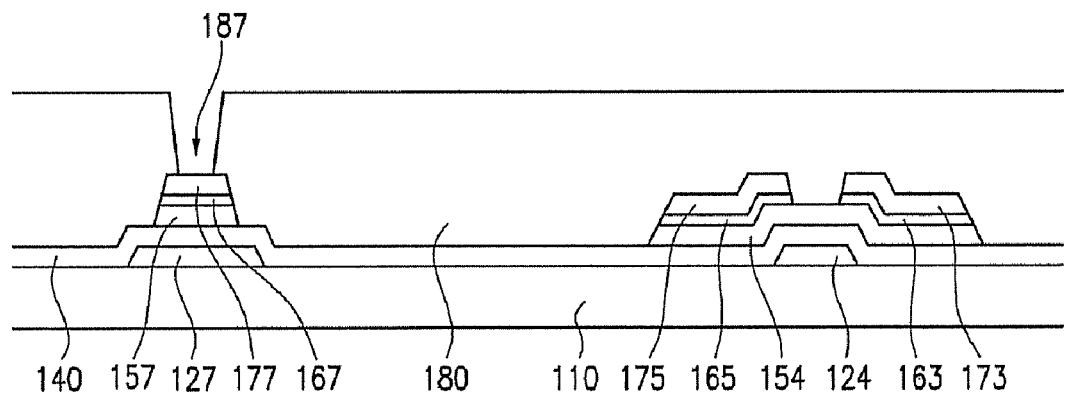
FIGS. 22a and 22b are cross-sectional views taken along lines 22a-22a and 22b-22b of FIG. 21.
Figure 22B:
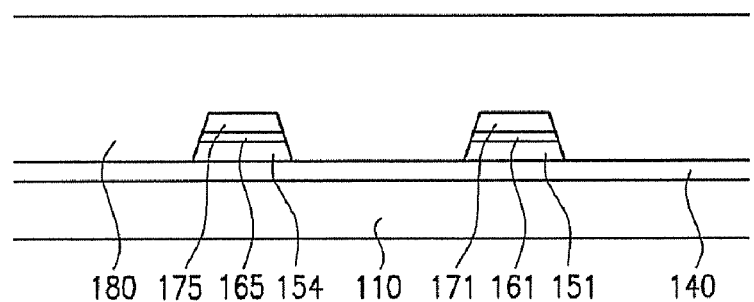

Then, as shown in FIGS. 21, 22a and 22b, the passivation layer 180 is formed by depositing an organic material over the substrate 110 and patterned by a photolithography process using a mask. At this time, the contact holes 187 and 182 are formed. The gate insulating layer 140 may be simultaneously etched to form a contact hole exposing the same layer as the gate lines 121.

Finally, referring back to FIGS. 12 to 14, one of the IZO and ITO layers is deposited in the thickness of about 500~1,500 Å by a sputtering method, and then the pixel electrodes 190 and the contact assistant members 82 are formed by a photolithography process. The IZO layer may be wet-etched using a solvent for chrome etching, for example, $HNO_3/(NH_4)_2Ce(NO_3)_6/H_2O$, and this solvent may prevent an aluminum-based conductive layer formed on the date lines 171, the drain electrodes 175 and the gate lines 121 from being eroded.

In this embodiment, the data lines 171, the storage capacitor conductor 177, the drain electrodes 175, the first, second and third ohmic contact layers 161, 165 and 167, and the first and second intrinsic semiconductor layers 151 and 157 are formed by one photolithography process. As a result, the manufacturing process may be simplified.

Furthermore, the wiring structure of the TFT array panel according the embodiments of the present invention may be applied to COA-LCD (Color filters On Array-LCD). Now, it will be described with reference to the drawings.

Figure 23:
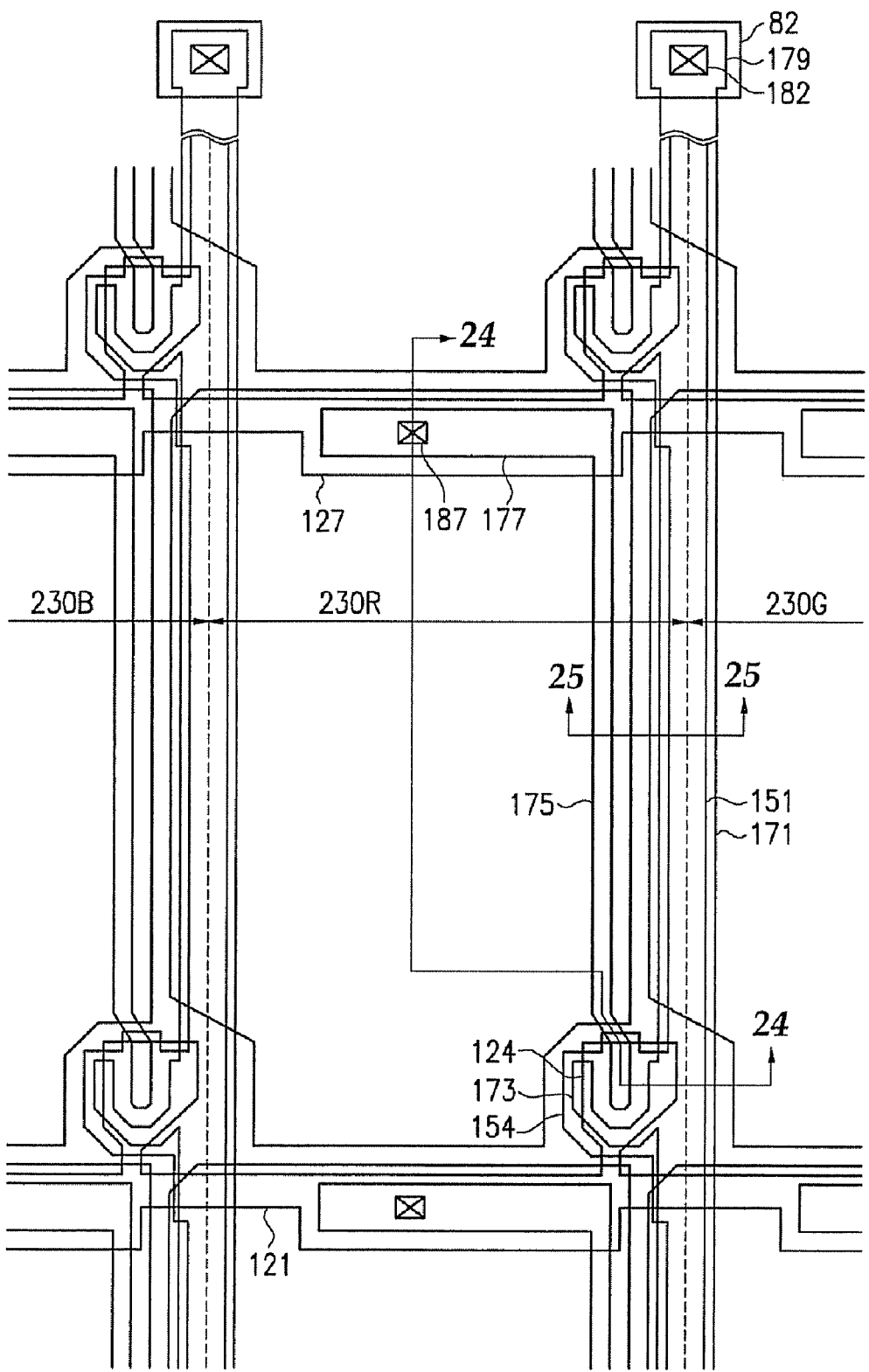
FIG. 23 is a cross-sectional view of the TFT array panel for the LCD device according to further another embodiment of the present invention.
Figure 24:
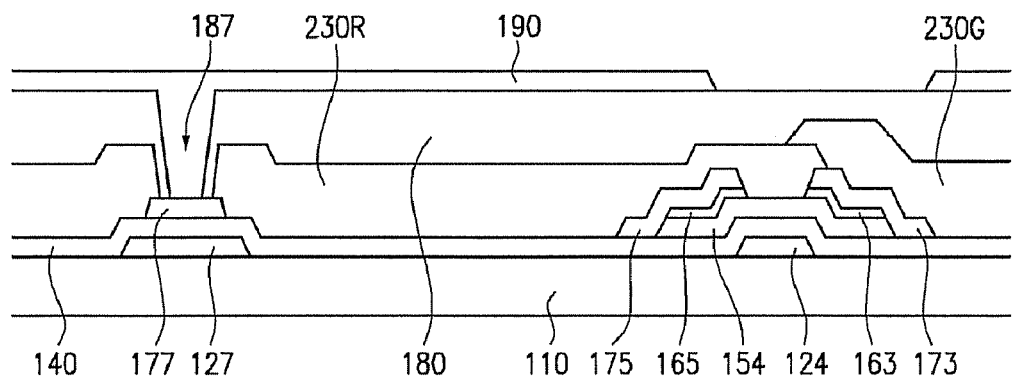
FIGS. 24 and 25 are cross-sectional views taken along lines 24-24 and 25-25 of FIG. 23.
Figure 25:
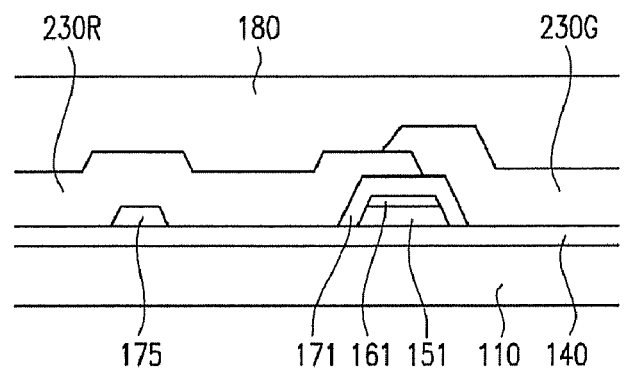

FIG. 23 is a layout view of the structure of the TFT panel array for the LCD device according to further another embodiment of the present invention, and FIGS. 24 and 25 are a cross-sectional view taken along lines 24-24 and 25-25 in FIG. 23. The TFT panel array for the LCD device has the same structure as that of FIGS. 1 and 2 except that R, G, B color filters 230R, 230G and 230B are formed on the TFT array. Now, the detailed description will be omitted and the same label and reference numerals will be used.

Herein, the boundaries of the R, G, B color filters 230R, 230G and 230B may match with the data lines 171, but may overlap the data lines 171. As a result, this structure may block leakage of light between the pixel regions.

Meanwhile, an insulating layer, which is made of an inorganic insulating material, for example, silicon nitride or silicon oxide, etc. may be added under the R, G, B color filters 230R, 230G and 230B to prevent the organic insulating material from contacting the semiconductor layer 151. At this time, the contact holes 187 exposing the storage capacitor conductors 177 may be formed between the color filters 230R, 230G and 230B. It should be noted that the COA-LCD device has the same effects as in the above embodiments.

The data lines 171 in the TFT array panel for the LCD device according to further another embodiment of the present invention are covered by the pixel electrodes 190. According to this configuration, the present invention may suppress variation of the parasitic capacitance between the pixel electrodes 190 and the data lines 171 due to the misalignment error in the manufacturing processes. In more detail, although the pixel electrodes 190 and the data lines 171 are misaligned in the manufacturing processes, the pixel voltage applied to the pixel electrode 190 is not varied.

The drain electrodes 175 are formed adjacent to the data lines 171 and are covered by the black matrixes, and are electrically connected to the pixel electrodes 190 through the contact holes 187. According to this configuration of the present invention, the increased aperture ratio is obtained.

Having described the embodiments of the present invention and its advantages, it should be noted that various changes, substitutions and alterations can be made herein without departing from the spirit and scope of the invention as defined by appended claims.

What is claimed is:

1. A method of manufacturing a thin film transistor (TFT) array panel on a substrate, comprising:
    forming a plurality of gate lines on the substrate;
    forming a plurality of gate electrodes by a photolithography process;
    forming a gate insulating layer on the substrate and the gate electrodes;
    forming a semiconductor layer on the gate insulating layer;
    forming an ohmic contact layer on the semiconductor layer;
    forming a desired active area by a photolithography process;
    forming a conductive layer on the gate insulating layer and the ohmic contact layer;
    forming a plurality of drain electrodes, data lines having a plurality of source electrodes, and a plurality of conductive patterns, wherein the drain electrodes extend parallel with and adjacent to the data lines and are directly connected to the conductive patterns, and wherein the conductive patterns overlap an adjacent gate line;
    forming an insulating layer on all of the data lines, the drain electrodes, the source electrodes, the gate insulating layer, and the conductive patterns, the insulating layer having a contact hole, and
    forming a plurality of pixel electrodes on the insulating layer, the pixel electrodes being electrically connected to the conductive patterns through the contact hole.

2. The method of claim 1, wherein the insulating layer is made of an organic material.

3. The method of claim 1, wherein the pixel electrodes cover both the drain electrodes and the data lines.

4. A method of manufacturing a thin film transistor (TFT) array panel on a substrate, comprising:
    forming a plurality of gate lines on the substrate;
    forming a plurality of gate electrodes patterned by a photolithography process using a mask;
    forming a gate insulating layer on the substrate and the gate electrodes;

forming a semiconductor layer on the gate insulating layer;

forming an ohmic contact layer on the semiconductor layer;

forming a conductive layer on the ohmic contact layer;

forming a plurality of drain electrodes, data lines having a plurality of source electrodes, and a plurality of conductive patterns, wherein the drain electrodes extend parallel with and adjacent to the data lines and are directly connected to the conductive patterns, and wherein the conductive patterns overlap an adjacent gate line;

forming an insulating layer on all of the data lines, the drain electrodes, the source electrodes, the gate insulating layer and the conductive patterns, the insulating layer having a contact hole, and forming a plurality of pixel electrodes on the insulating layer, the pixel electrodes being electrically connected to the conductive patterns through the contact hole.

5. The method of claim 4, wherein the conductive patterns have a three-layered structure.

6. The method of claim 5, wherein the three-layered structure is layered in the order of the semiconductor layer, the ohmic contact layer, and the conductive pattern.

7. The method of claim 4, wherein the drain electrodes have a three-layered structure.

8. The method of claim 7, wherein the three-layered structure is layered in the order of the semiconductor layer, the ohmic contact layer, and the conductive pattern.

9. The method of claim 4, wherein the insulating layer is made of an organic material.

10. The method of claim 4, wherein the pixel electrodes cover an adjacent data line.

11. The method of claim 10, wherein the pixel electrodes cover the drain electrodes.

* * * * *